(12) United States Patent
Fu

(10) Patent No.: US 11,694,956 B2
(45) Date of Patent: Jul. 4, 2023

(54) SEMICONDUCTOR CIRCUIT FOR MEMORY DEVICE AND METHOD OF MANUFACTURING THE SAME

(71) Applicant: TAIWAN SEMICONDUCTOR MANUFACTURING COMPANY LTD., Hsinchu (TW)

(72) Inventor: Chin-Ming Fu, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 103 days.

(21) Appl. No.: 17/098,014

(22) Filed: Nov. 13, 2020

(65) Prior Publication Data
US 2022/0157716 A1 May 19, 2022

(51) Int. Cl.
*H01L 23/522* (2006.01)
*G11C 7/10* (2006.01)
*H01L 23/528* (2006.01)
*H01L 23/535* (2006.01)
*H10B 99/00* (2023.01)

(52) U.S. Cl.
CPC ........ *H01L 23/5228* (2013.01); *G11C 7/1048* (2013.01); *H01L 23/5226* (2013.01); *H01L 23/5283* (2013.01); *H01L 23/535* (2013.01); *H10B 99/00* (2023.02)

(58) Field of Classification Search
CPC .................. H01L 23/5228; H01L 23/5226
See application file for complete search history.

(56) References Cited

U.S. PATENT DOCUMENTS

2019/0067103 A1* 2/2019 Zhang ............... H01L 21/76843
2021/0075406 A1* 3/2021 Kim ..................... H01L 23/5226

* cited by examiner

Primary Examiner — Farun Lu
(74) Attorney, Agent, or Firm — WPAT Law; Anthony King

(57) ABSTRACT

A semiconductor component for a memory device is provided. The semiconductor component comprises a first active region extending in a first direction; a second active region extending in the first direction; a first conductive layer disposed across the first active region and the second active region, in a second direction substantially perpendicular to the first direction; a second conductive layer extending in the first direction; and a first conductive via connecting the first conductive layer and the second conductive layer.

20 Claims, 16 Drawing Sheets

SEMICONDUCTOR CIRCUIT FOR MEMORY DEVICE AND METHOD OF MANUFACTURING THE SAME

BACKGROUND

The present disclosure relates, in general, to semiconductor circuits for memory devices and methods of manufacturing the same. Specifically, the present disclosure relates to on-die termination (ODT) circuits for memory devices and methods of manufacturing the same.

In the field of electronics, electrical termination is the practice of ending a transmission line with a device that matches the characteristic impedance of the line. The electrical termination prevents signals from reflecting off the end of the transmission line. Reflections at the ends of unterminated transmission lines cause distortion which can produce ambiguous digital signal levels and mis-operation of digital systems. Reflections in analog signal systems cause effects such as video ghosting, or power loss in radio transmitter transmission lines.

On-die termination (ODT) is a technology wherein the electrical termination for impedance matching in transmission lines is located inside a semiconductor chip instead of on a printed circuit board (PCB). In the field of memory devices, such as double data rate synchronous dynamic random access memory (DDR SDRAM) or LPDDR (Low Power DDR) SDRAM, high linearity is required for similar resistance under different pad voltage. In the existing techniques, titanium nitride (TiN) resistors are usually used in order to enhance the linearities for the drivers or the ODTs of DDR/LPDDR. Nevertheless, the size or dimension of a TiN resistor cannot be reduced as the manufacturing process evolves. Furthermore, routings between TiN resistors and transistors would also be an issue in achieving a more compact size for memory devices.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
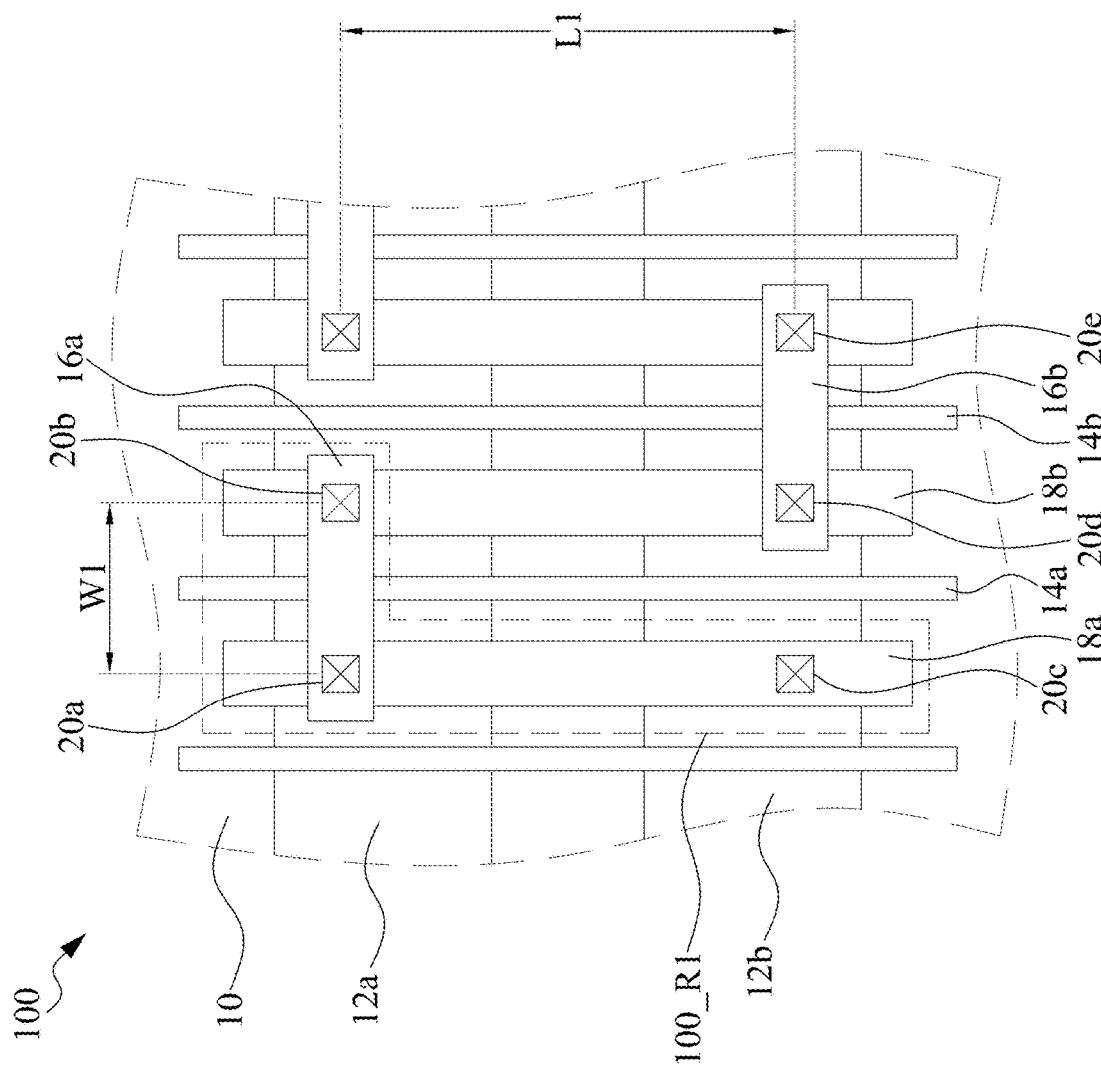
FIG. 1 illustrates a top view of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A methodology is proposed for utilizing the parasitic resistances of the transistors as the ODT. The proposed methodology can enhance the linearity of the ODT, and at the same time the size/dimension of the ODT can be reduced as the manufacturing process evolves.

FIG. 1 illustrates a top view of a semiconductor device, in accordance with some embodiments of the present disclosure.

FIG. 1 shows a semiconductor device 100. The semiconductor device 100 can be a portion of an electrical device. The semiconductor device 100 can be a portion of a termination circuit of an electrical device. The semiconductor device 100 can be a portion of a driver/driving circuit of an electrical device. The semiconductor device 100 can be integrated with a memory device.

The semiconductor device 100 includes a substrate 10, active regions 12a and 12b, gate regions 14a and 14b, conductive layers 16a, 16b, 18a and 18b, and conductive vias 20a, 20b, 20c, 20d and 20e. The active regions 12a and 12b can be the source region or the drain region of a transistor. The gate regions 14a and 14b can be a polysilicon gate or a metal gate. The conductive layers 16a and 16b can extend in a substantially identical direction. The conductive layers 16a and 16b can be substantially parallel to each other. The conductive layers 18a and 18b can extend in a direction different from that of the conductive layers 16a and 16b. The conductive layers 18a and 18b can be substantially parallel to each other. The conductive layers 18a and 18b can be substantially perpendicular to the conductive layers 16a and 16b. The conductive layers 16a, 16b, 18a and 18b can be disposed on the same side of the substrate 10.

The conductive layers 16a and 16b can be referred to as horizontal metal layers in the subsequent paragraphs. The conductive layers 18a and 18b can be referred to as vertical metal layers in the subsequent paragraphs.

The conductive via 20a can be in contact with both the conductive layer 16a and the conductive layer 18a. The conductive via 20b can be in contact with both the conductive layer 16a and the conductive layer 18b. The conductive via 20a can penetrate both the conductive layer 16a and the conductive layer 18a. The conductive via 20b can penetrate both the conductive layer 16a and the conductive layer 18b.

The conductive layer 18a can be electrically connected to the conductive layer 18b through the conductive layer 16a and the conductive vias 20a and 20b. The conductive vias 20a and 20b can also be in contact with the active region 12a. At least a portion of the conductive vias 20a can be embedded within the active region 12a. At least a portion of the conductive vias 20b can also be embedded within the active region 12a.

The active regions 12a and 12b can be electrically connected through the conductive layer 18a and the conductive vias 20a and 20c. At least a portion of the conductive vias 20c can be embedded within the active region 12b.

The gate region 14a can be disposed between the conductive layer 18a and the conductive layer 18b. The gate region 14a can be isolated from the conductive layers 16a, 18a and 18b. The gate region 14a can be separated from the conductive layers 16a, 18a and 18b. The gate region 14a can be spaced apart from the conductive layers 16a, 18a and 18b.

In some embodiments, the conductive layer extending in the horizontal direction of FIG. 1 (i.e., conductive layer 16a) can be connected between two adjacent conductive layers (i.e., conductive layers 18a and 18b) that extend in the vertical direction. In some other embodiments, the horizontal conductive layer can connect two vertical conductive layers that are not adjacent to each other.

The conductive layer 16a, the conductive layer 18a and the conductive vias 20a, 20b and 20c can correspond to a resistor 100_R1. The resistor 100_R1 can be used as a basic component/unit for the ODT. The dimension or the size of the resistor 100_R1 can be characterized by a width W1 and a length L1. The width W1 can be the distance measured from the geometric center of the conductive via 20a to the geometric center of the conductive via 20b. The length L1 can be the distance measured from the geometric center of the conductive via 20a to the geometric center of the conductive via 20c.

In some embodiments, the width W1 can range from approximately 45 nanometers (nm) to approximately 3240 nm. In some embodiments, the length L1 can range from approximately 27 nm to approximately 642 nm. In some embodiments, the ratio W1/L1 can range from approximately 0.07 to approximately 120.

Figure 2:
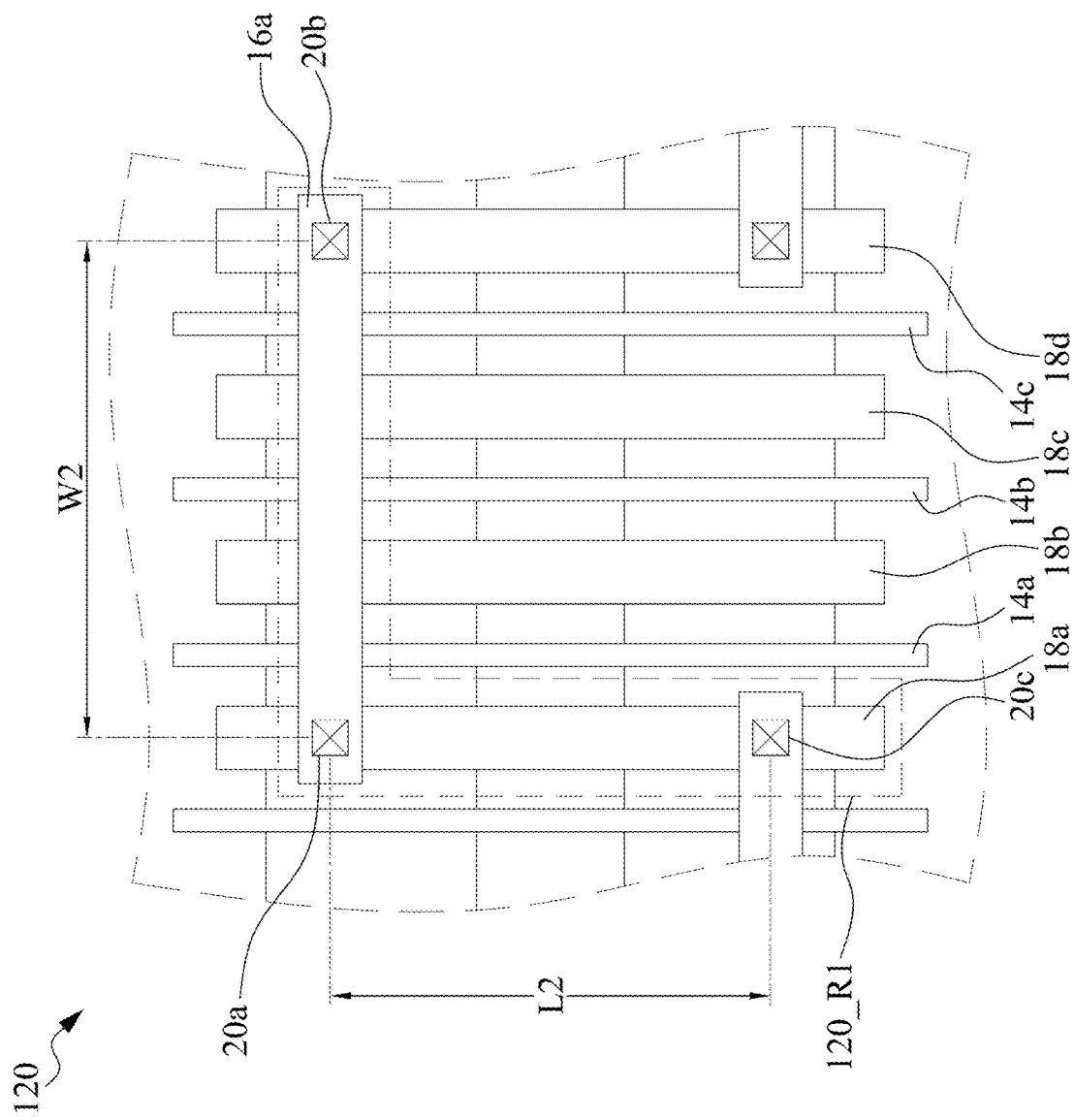
FIG. 2 illustrates a top view of a semiconductor device, in accordance with some embodiments of the present disclosure.

FIG. 2 illustrates a top view of a semiconductor device, in accordance with some embodiments of the present disclosure. FIG. 2 shows a semiconductor device 120. The semiconductor device 120 can be a portion of an electrical device. The semiconductor device 120 can be a portion of a termination circuit or a driver/driving circuit of an electrical device. The semiconductor device 120 can be integrated with a memory device.

The semiconductor device 120 is similar to the semiconductor device 100 shown in FIG. 1, except that the conductive layer 16a is connected between two vertical conductive layers (i.e., conductive layers 18a and 18b) that are not adjacent to each other. Referring to FIG. 2, two conductive layers 18b and 18c can be disposed between the conductive layers 18a and 18d. In addition, three gate regions 14a, 14b and 14c can be disposed between the conductive layers 18a and 18d.

The conductive layer 16a can be isolated from the conductive layers 18b and 18c. The conductive layer 16a can be spaced apart from the conductive layers 18b and 18c. The conductive layer 16a can be isolated from the gate regions 14a, 14b and 14c. The conductive layer 16a can be spaced apart from the gate regions 14a, 14b and 14c.

The conductive layer 16a, the conductive layer 18a and the conductive vias 20a, 20b and 20c can correspond to a resistor 120_R1. The resistor 120_R1 can be used as a basic component/unit for the ODT. The dimension or the size of the resistor 120_R1 can be characterized by a width W2 and a length L2. The width W2 can be the distance measured from the geometric center of the conductive via 20a to the geometric center of the conductive via 20b. The length L2 can be the distance measured from the geometric center of the conductive via 20a to the geometric center of the conductive via 20c.

In some embodiments, the width W2 can range from approximately 45 nm to approximately 3240 nm. In some embodiments, the length L2 can range from approximately 27 nm to approximately 642 nm. In some embodiments, the ratio W2/L2 can range from approximately 0.07 to approximately 120.

Figure 3:
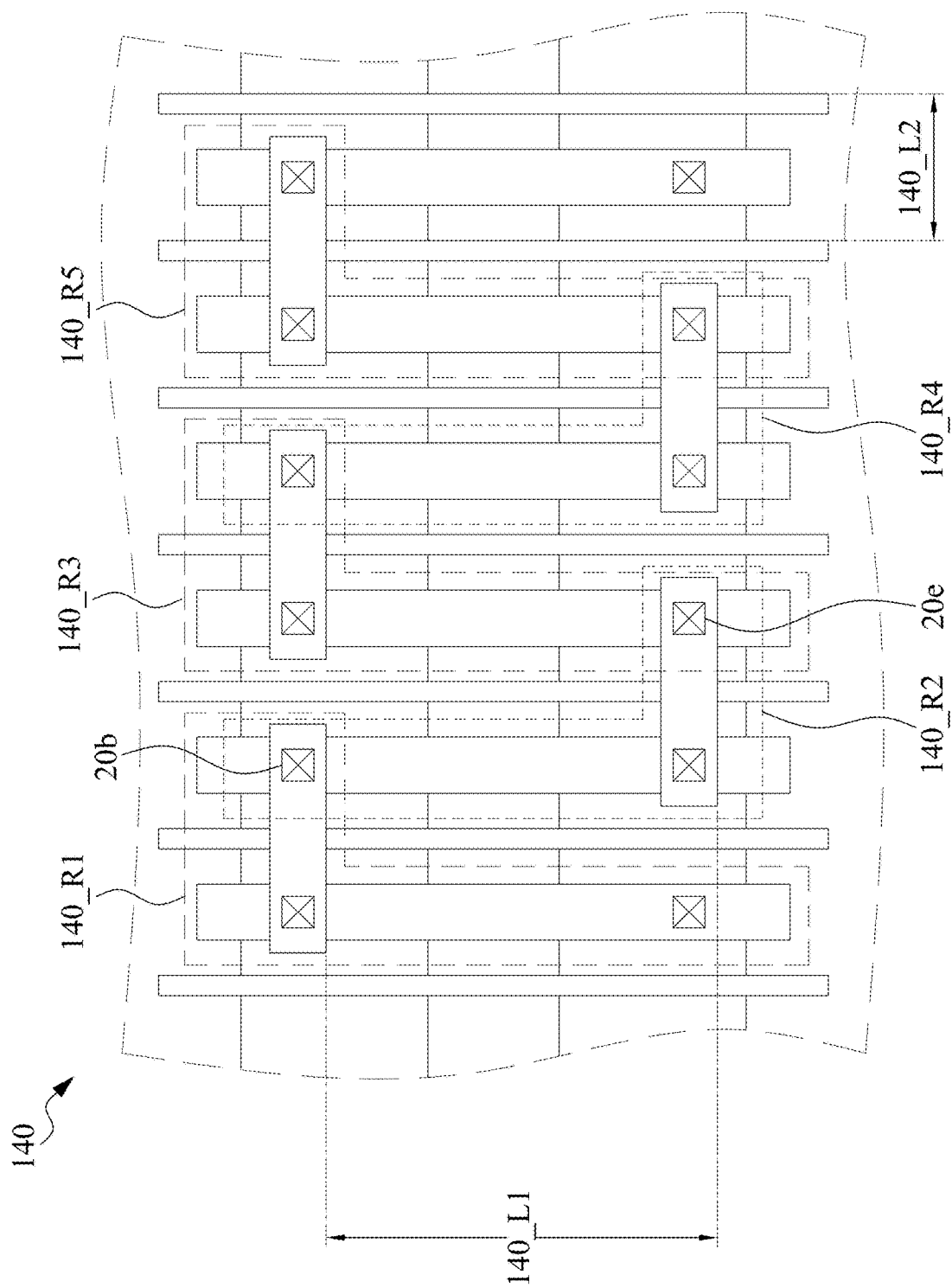
FIG. 3 illustrates a top view of a semiconductor device, in accordance with some embodiments of the present disclosure.

FIG. 3 illustrates a top view of a semiconductor device, in accordance with some embodiments of the present disclosure. FIG. 3 shows a semiconductor device 140. The semiconductor 140 is similar to the semiconductor 100 of FIG. 1. The calculation of the resistance of a basic component/unit for the ODT will be discussed in accordance with FIG. 3.

The semiconductor 140 includes resistors 140_R1, 140_R2, 140_R3, 140_R4 and 140_R5. Each of the resistors 140_R1, 140_R2, 140_R3, 140_R4 and 140_R5 can be a basic component/unit for the ODT.

Referring to FIG. 3, each of the resistors 140_R1, 140_R2, 140_R3, 140_R4 and 140_R5 includes a horizontal conductive layer and a vertical metal layer. In addition, each of the resistors 140_R1, 140_R2, 140_R3, 140_R4 and 140_R5 includes three conductive vias, and two adjacent resistors share one conductive via. For example, the resistors 140_R1 and 140_R2 share the conductive via 20b, and the resistors 140_R2 and 140_R3 share the conductive via 20e.

Therefore, the resistance of a basic component/unit for the ODT can be calculated based on the resistance of a horizontal conductive layer, the resistance a vertical metal layer, and the resistance of two conductive vias. The resistors 100_R1, 120_R1 and 140_R1 to 140_R5 can be referred to as the TYPE_A resistor, and the resistance of TYPE_A resistor can be calculated using the equation below:

$$R_{TYPE\_A} = n1 \times R_V + m1 \times R_H + 2 \times R_C \quad \text{(equation 1)}$$

Wherein the symbol $R_V$ represents the resistance per pitch of a vertical conductive layer, the symbol $R_H$ represents the resistance per pitch of a horizontal conductive layer, the symbol $R_C$ represents the resistance of a conductive via. The number n1 represents a multiple, and the number m1 represents a multiple. In the subject application, a pitch refers to the minimum center-to-center distance (or edge-to-edge distance) between conductive layers or gate regions.

For example, if the pitch between two horizontal metal lines of the semiconductor device 140 is 0.035 micrometers (um), then the distance 140_L1 can be n1 times of 0.035 um. For example, if the pitch between two gate regions of the semiconductor device 140 is 0.057 um, then the distance 140_L2 can be m1 times of 0.057 um. It should be noted that the number n1 and the number m1 can be selected during the manufacturing of the semiconductor device 140, and the value of the $R_{TYPE\_A}$ can vary depending on the numbers n1 and m1 selected.

Furthermore, the total resistance of the semiconductor device 140 can be calculated using the equation below:

$$R_{TOTAL\_A} = p1 \times R_{TYPE\_A} \quad \text{(equation 2)}$$

Wherein the number p1 represents the number of TYPE_A resistors that the semiconductor device 140 includes. Table 1 below shows the value of the resistance $R_{TOTAL\_A}$ in different cases with various combinations of the number m1, n1 and p1. The total resistance $R_{TOTAL\_A}$ is calculated assuming that the $R_V$ is 30 ohms (Ω), that $R_H$ is 50Ω, and that $R_C$ is 40Ω.

TABLE 1

| Cases: | No. 1 | No. 2 | No. 3 | No. 4 | No. 5 |
|---|---|---|---|---|---|
| m1 | 1 | 2 | 1 | 3 | 2 |
| n1 | 6 | 10 | 8 | 4 | 20 |
| p1 | 2 | 1 | 3 | 4 | 2 |
| $R_{TOTAL\_A}$ (Ω) | 620 | 480 | 1110 | 1400 | 1560 |

Figure 4A:
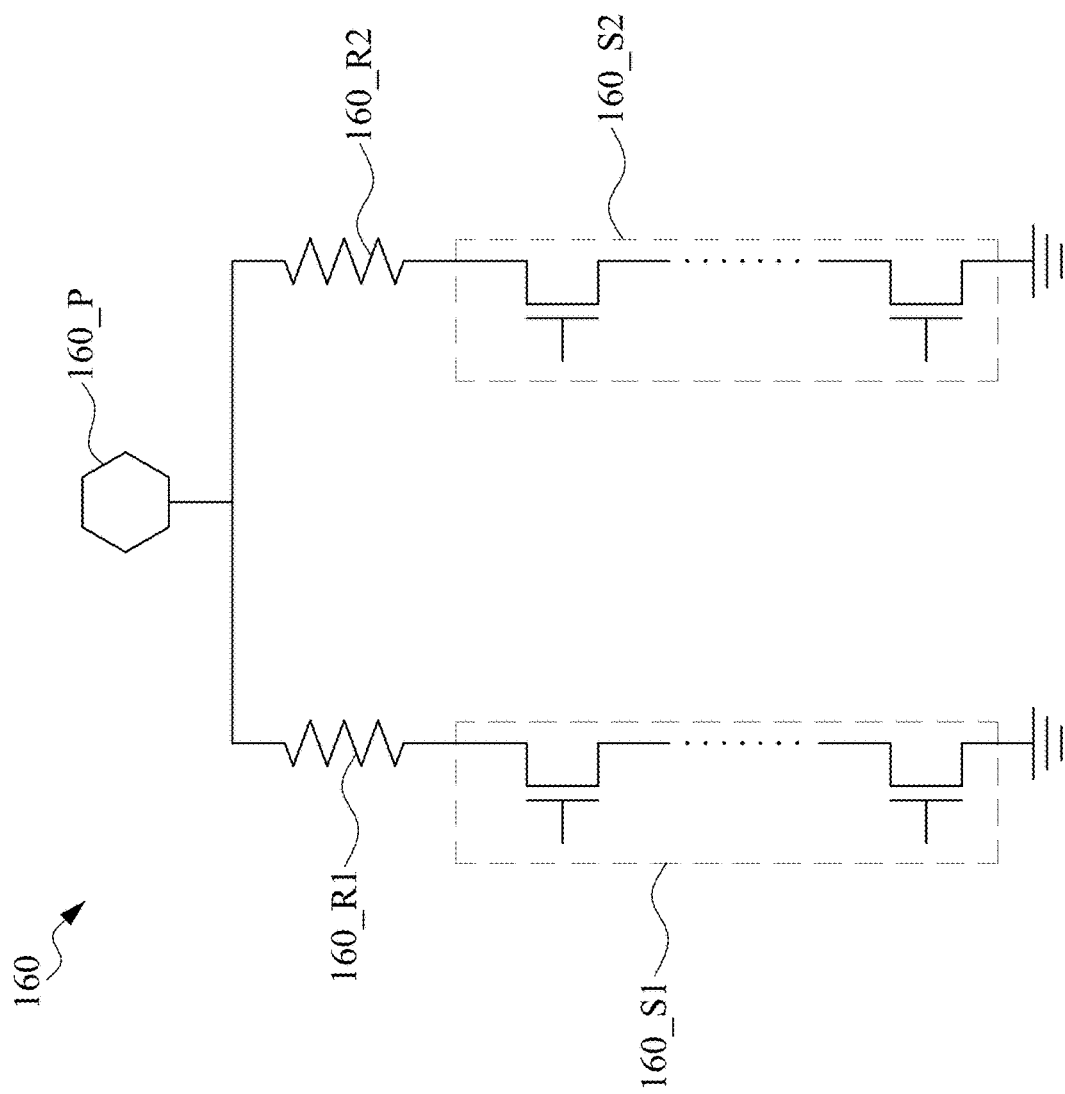
FIG. 4A illustrates a schematic view of a circuit, in accordance with some embodiments of the present disclosure.

FIG. 4A illustrates a schematic view of a circuit, in accordance with some embodiments of the present disclosure. FIG. 4A shows a circuit 160. The circuit 160 can be a termination circuit of an electrical device. The circuit 160 can be a driver/driving circuit of an electrical device. The circuit 160 can be integrated with a memory device. The circuit 160 can be an on-die termination or a driver/driving circuit of a memory device.

The circuit 160 includes a pad 160_P, resistors 160_R1 and 160_R2, and transistor stacks 160_S1 and 160_S2. The transistor stack 160_S1 can include a plurality of transistors, wherein a drain terminal of one transistor is connected to the source terminal of another transistor. The transistor stack 160_S2 can include a plurality of transistors, wherein a drain terminal of one transistor is connected to the source terminal of another transistor.

In some embodiments, the transistors included in the transistor stacks 160_S1 and the 160_S2 can be n-type Metal-Oxide-Semiconductor Field-Effect Transistor (MOSFET). In some embodiments, the transistors included in the transistor stacks 160_S1 and the 160_S2 can be p-type MOSFETs. In some embodiments, the number of transistors included in the transistor stack 160_S1 can be identical to that included in the transistor stack 160_S2. In some embodiments, the number of transistors included in the transistor stack 160_S1 can be different from that included in the transistor stack 160_S2.

The pad 160_P can be a conductive contact that is configured to be connected to external devices. In some embodiments, the pad 160_P can be a contact of a memory device that is configured to, for example, connect a slot for receiving the memory device.

The resistor 160_R1 can be a TYPE_A resistor as elaborated in accordance with FIGS. 1-3. The resistor 160_R2 can be a TYPE_A resistor as elaborated in accordance with FIGS. 1-3. In some embodiments, the resistance of the resistor 160_R1 can be identical to that of the resistor 160_R2. In some embodiments, the resistance of the resistor 160_R1 can be different from that of the resistor 160_R2.

Figure 4B:
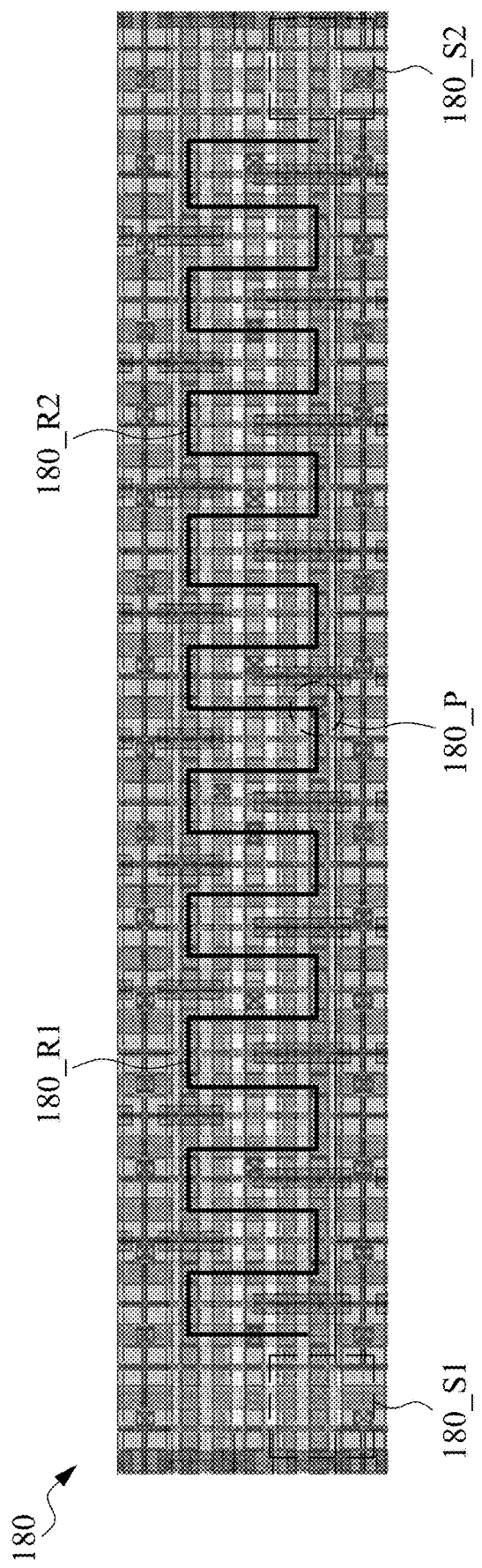
FIG. 4B illustrates a schematic view of a semiconductor layout, in accordance with some embodiments of the present disclosure.

FIG. 4B illustrates a schematic view of a semiconductor layout, in accordance with some embodiments of the present disclosure. FIG. 4B shows a semiconductor layout 180. The semiconductor layout 180 can correspond to the circuit 160 shown in FIG. 4A.

The semiconductor layout 180 includes a pad 180_P, resistors 180_R1 and 180_R2, and transistor stacks 180_S1 and 180_S2. The resistor 180_R1 can be disposed between the pad 180_P and the transistor stack 180_S1. The resistor 180_R1 can be electrically connected between the pad 180_P and the transistor stack 180_S1. The resistor 180_R2 can be disposed between the pad 180_P and the transistor stack 180_S2. The resistor 180_R2 can be electrically connected between the pad 180_P and the transistor stack 180_S2.

Figure 5:
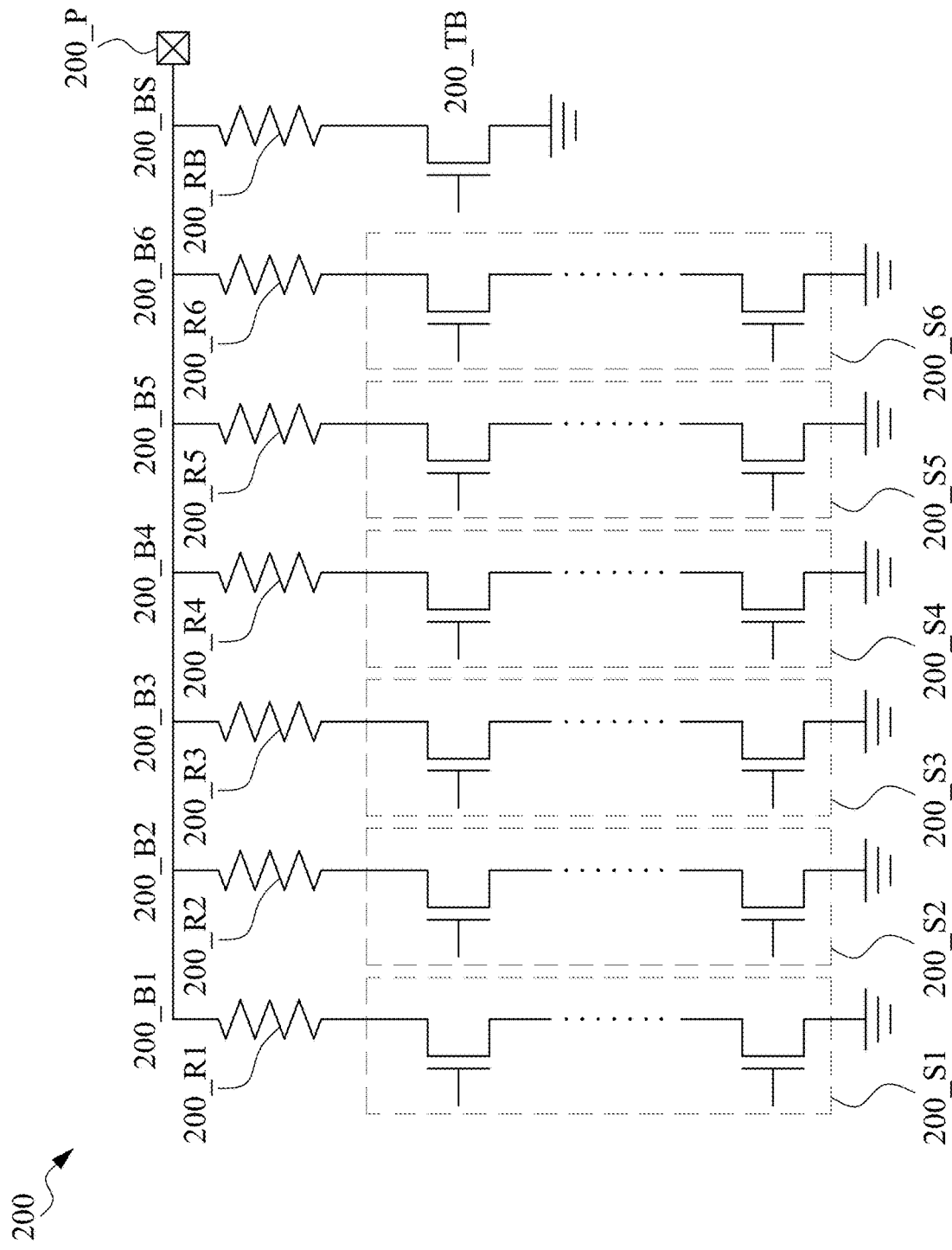
FIG. 5 illustrates a schematic view of a circuit, in accordance with some embodiments of the present disclosure.

FIG. 5 illustrates a schematic view of a circuit, in accordance with some embodiments of the present disclosure.

The pad 200_P can be a conductive contact that is configured to be connected to external devices. In some embodiments, the pad 200_P can be a contact of a memory device that is configured to, for example, connect a slot for receiving the memory device.

Table 2 below shows the value of the resistances of the branches 200_B1, 200_B2, 200_B3, 200_B4, 200_B5, 200_B6 and 200_BS, in accordance with some exemplary embodiments of the present disclosure. Table 2 shows the resistances of the branches 200_B1, 200_B2, 200_B3, 200_B4, 200_B5, 200_B6 and 200_BS, in which various combinations of the number of the TYPE_A resistors in the resistors 200_R1 to 200_R6 and 200_RB, and the number of the transistors in the transistor stacks 200_S1 to 200_S6 are listed.

TABLE 2

| Branch | Number of TYPE_A resistors | Number of transistors in the transistor stack | Resistance of TYPE_A resistors (Ω) | Resistance of the transistor stack (Ω) | Total resistance (Ω) | Ratio between TYPE_A resistance and stack resistance |
|---|---|---|---|---|---|---|
| 200_B1 | 24 | 18 | 1228 | 14082 | 15310 | 8.02% |
| 200_B2 | 12 | 9 | 614 | 7041 | 7655 | 8.02% |
| 200_B3 | 12 | 4 | 614 | 3299 | 3913 | 15.69% |
| 200_B4 | 12 | 4 | 614 | 1332 | 1946 | 31.55% |
| 200_B5 | 6 | 2 | 307 | 696 | 1003 | 30.61% |
| 200_B6 | 3 | 2 | 153.5 | 347.5 | 501 | 30.64% |
| 200_BS | 4 | 1 | 204.67 | 207.58 | 412.25 | 49.65% |

FIG. 5 shows a circuit 200. The circuit 200 can be a termination circuit of an electrical device. The circuit 200 can be a driver/driving circuit of an electrical device. The circuit 200 can be integrated with a memory device. The circuit 200 can be an on-die termination or a driver/driving circuit of a memory device.

The circuit 200 includes branches 200_B1, 200_B2, 200_B3, 200_B4, 200_B5, 200_B6, and 200_BS. The circuit 200 further includes a pad 200_P electrically connected with the branches 200_B1, 200_B2, 200_B3, 200_B4, 200_B5, 200_B6, and 200_BS.

The branch 200_B1 includes a resistor 200_R1 and a transistor stack 200_S1. The branch 200_B2 includes a resistor 200_R2 and a transistor stack 200_S2. The branch 200_B3 includes a resistor 200_R3 and a transistor stack 200_S3. The branch 200_B4 includes a resistor 200_R4 and a transistor stack 200_S4. The branch 200_B5 includes a resistor 200_R5 and a transistor stack 200_S5. The branch 200_B6 includes a resistor 200_R6 and a transistor stack 200_S6. The branch 200_BS includes a resistor 200_RB and a transistor 200_TB.

Each of the resistors 200_R1 to 200_R6 and 200_RB can be a TYPE_A resistor as elaborated in accordance with FIGS. 1-3. The resistors 200_R1 to 200_R6 can have different resistances. Each of the transistor stacks 200_S1 to 200_S6 can include a plurality of transistors, wherein for each transistor stack 200_S1 to 200_S6, a drain terminal of one transistor is connected to the source terminal of another transistor. The transistor stacks 200_S1 to 200_S6 can include different numbers of transistors.

In some embodiments, the transistors included in the transistor stacks 200_S1 to 200_S6 can be n-type MOSFETs. In some embodiments, the transistors included in the transistor stacks 200_S1 to 200_S6 can be p-type MOSFETs.

Please be advised that the contents shown in Table 2 are for the purpose of illustration, and it can be contemplated that the circuit 200 may include a branch that has TYPE_A resistors and transistors of numbers different from those shown in Table 2.

Referring to Table 2, the branch 200_B1 includes 24 TYPE_A resistors and 18 transistors, wherein the TYPE_A resistors and the transistors contribute a resistance of 1228Ω and 14082Ω, respectively. The total resistance of the branch 200_B1 is 15310Ω. Among the 15310Ω total resistance, the resistance contributed by the TYPE_A resistors (i.e., the resistor 200_R1) can be referred to as the linear portion of the total resistance, and the resistance contributed by the transistors (i.e., the transistor stack 200_S1) can be referred to as the non-linear portion of the total resistance. For the branch 200_B1, the ratio between TYPE_A resistance and stack resistance (i.e., the ratio between the linear portion and the non-linear portion of the total resistance) is 8.02%.

The contents of Table 2 for the branches 200_B2 to 200_B6 and 200_BS can be interpreted in the same manner as that elaborated on above regarding the branch 200_B1.

For example, referring to Table 2, the branch 200_B3 includes 12 TYPE_A resistors and 4 transistors, wherein the TYPE_A resistors and the transistors contribute a resistance of 614Ω and 3299Ω, respectively. The total resistance of the branch 200_B3 is 3913Ω. Among the 3913Ω total resistance, the resistance contributed by the resistor 200_R3 can be referred to as the linear portion of the total resistance, and the resistance contributed by the transistor stack 200_S3 can be referred to as the non-linear portion of the total resistance. For the branch 200_B3, the ratio between TYPE_A resistance and stack resistance (i.e., the ratio between the linear portion and the non-linear portion of the total resistance) is 15.69%.

For example, referring again to Table 2, the branch 200_B6 includes 3 TYPE_A resistors and 2 transistors, wherein the TYPE_A resistors and the transistors contribute a resistance of 153.5Ω and 347.5Ω, respectively. The total resistance of the branch 200_B6 is 501Ω. Among the 501Ω total resistance, the resistance contributed by the resistor 200_R6 can be referred to as the linear portion of the total resistance, and the resistance contributed by the transistor stack 200_S6 can be referred to as the non-linear portion of the total resistance. For the branch 200_B6, the ratio between TYPE_A resistance and stack resistance (i.e., the ratio between the linear portion and the non-linear portion of the total resistance) is 30.64%.

With respect to the branch 200_BS, it includes 4 TYPE_A resistors and only one 1 transistor, wherein the TYPE_A resistors and the transistors contribute a resistance of 204.67Ω and 207.58Ω, respectively. The total resistance of the branch 200_BS is 412.25Ω. For the branch 200_BS, the ratio between TYPE_A resistance and stack resistance (i.e., the ratio between the linear portion and the non-linear portion of the total resistance) is 49.65%.

The number of the TYPE_A resistors in the resistors 200_R1 to 200_R6 and 200_RS and the number of the transistors in the transistor stack 200_S1 to 200_S6 are illustrated above for the purpose of illustration, and it can be contemplated that the circuit 200 may include a branch that has TYPE_A resistors and transistors of numbers different from those illustrated above.

With the branches 200_B1 to 200_B6, the circuit 200 can be configured to have different resistances. With the branches 200_B1 to 200_B6, the circuit 200 can be configured to have different linearity. For example, some branches of the circuit 200 can be configured to be activated while the remaining branches can be deactivated. Based on different design demands, a user can select different ratios of the TYPE_A resistor to transistor resistance. A user can select different TYPE_A resistor to transistor resistance ratios to achieve the required linearity. A user can select different TYPE_A resistor to transistor resistance ratios to achieve the required resistance.

Dynamic ratio of TYPE_A resistor to transistor resistance of the driver/driving circuit or on-die termination of a memory device can achieve better area efficiency with acceptable linearity. For example, having more transistors in one branch of the circuit 200 may facilitate the miniaturization of the circuit 200, while having more TYPE_A resistors in one branch of the circuit 200 may facilitate the linearity of the circuit 200.

Figure 6:
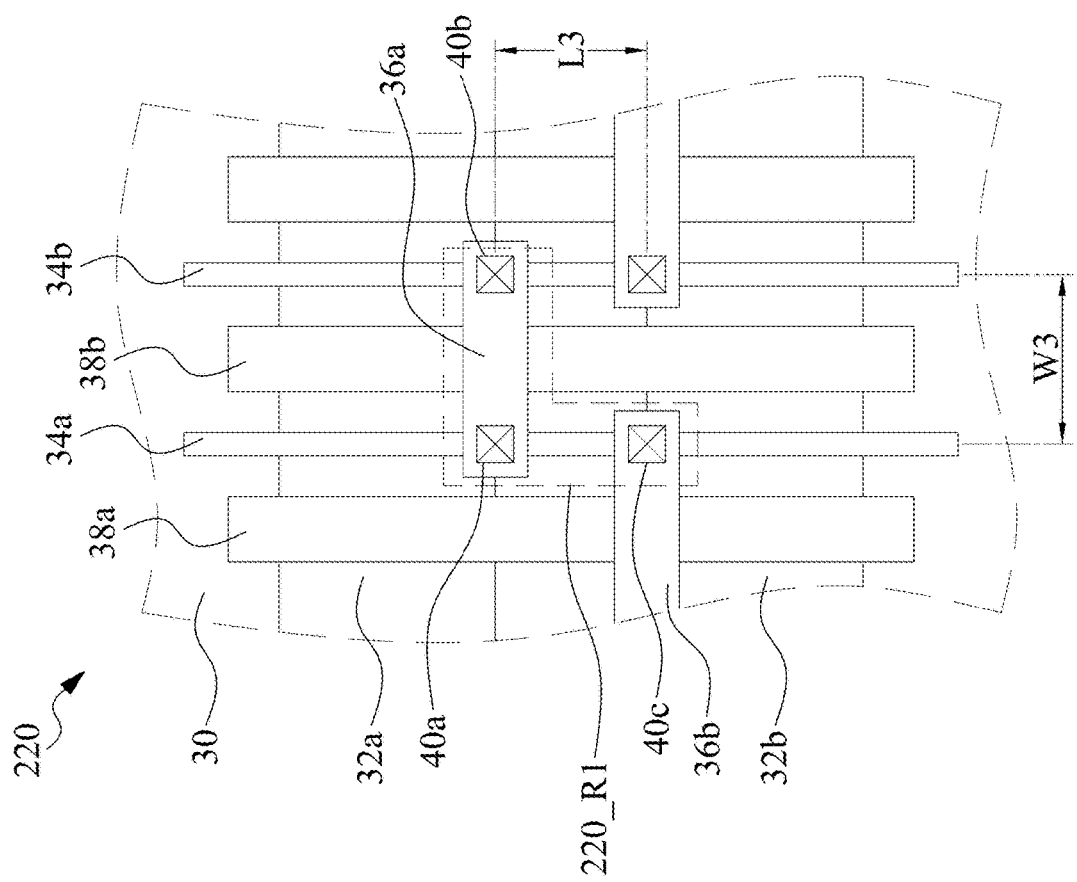
FIG. 6 illustrates a top view of a semiconductor device, in accordance with some embodiments of the present disclosure.

FIG. 6 illustrates a top view of a semiconductor device, in accordance with some embodiments of the present disclosure. FIG. 6 shows a semiconductor device 220. The semiconductor device 220 can be a portion of an electrical device. The semiconductor device 220 can be a portion of a termination circuit of an electrical device. The semiconductor device 220 can be a portion of a driver/driving circuit of an electrical device. The semiconductor device 220 can be integrated with a memory device.

The semiconductor device 220 includes a substrate 30, active regions 32a and 32b, gate regions 34a and 34b, conductive layers 36a, 36b, 38a and 38b, and conductive vias 40a, 40b and 40c.

The active regions 32a and 32b can be the source region or the drain region of a transistor. The gate regions 34a and 34b can be a polysilicon gate or a metal gate. The conductive layers 36a and 36b can extend in a substantially identical direction. The conductive layers 36a and 36b can be substantially parallel to each other. The conductive layers 38a and 38b can extend in a direction different from that of the conductive layers 36a and 36b. The conductive layers 38a and 38b can be substantially parallel to each other. The conductive layers 38a and 38b can be substantially perpendicular to the conductive layers 36a and 36b. The conductive layers 36a, 36b, 38a and 38b can be disposed on the same side of the substrate 30.

The conductive layers 36a and 36b can be referred to as horizontal metal layers in the subsequent paragraphs. The conductive layers 38a and 38b can be referred to as vertical metal layers in the subsequent paragraphs.

The conductive via 40a can be in contact with both the conductive layer 36a and the gate region 34a. The conductive via 40b can be in contact with both the conductive layer 36a and the gate region 34b. The conductive via 40c can be in contact with both the conductive layer 36b and the gate region 34a.

The conductive via 40a can penetrate both the conductive layer 36a and the gate region 34a. The conductive via 40b can penetrate both the conductive layer 36a and the gate region 34b. The conductive via 40c can penetrate both the conductive layer 36b and the gate region 34a.

The conductive layer 36a can be electrically connected to the gate region 34a through the conductive vias 40a. The conductive layer 36a can be electrically connected to the gate region 34b through the conductive vias 40b. The conductive layer 36b can be electrically connected to the gate region 34a through the conductive vias 40c.

The conductive vias 40a and 40b can also be in contact with the active region 32a. The conductive via 40c can also be in contact with the active region 32b. At least a portion of the conductive vias 40a can be embedded within the active region 32a. At least a portion of the conductive vias 40b can also be embedded within the active region 32a. At least a portion of the conductive vias 40c can be embedded within the active region 32b.

The gate region 34a can be disposed between the conductive layer 38a and the conductive layer 38b. The gate region 34a can be isolated from the conductive layers 38a and 38b. The gate region 34a can be separated from the conductive layers 38a and 38b. The gate region 34a can be spaced apart from the conductive layers 38a and 38b.

In some embodiments, the conductive layer extending in the horizontal direction of FIG. 6 (i.e., conductive layer 36a or 36b) can be connected between two adjacent gate regions (i.e., gate regions 34a and 34b) that extend in the vertical direction. In some other embodiments, the horizontal conductive layer can connect two gate regions that are not adjacent to each other.

The conductive layer 36a, the gate region 34a and the conductive vias 40a, 40b and 40c can correspond to a resistor 220_R1. The resistor 220_R1 can be used as a basic component/unit for the ODT. The dimension or the size of the resistor 220_R1 can be characterized by a width W3 and a length L3. The width W3 can be the center-to-center (or edge-to-edge) distance between the gate regions 34a and 34b. The length L3 can be the distance measured from the geometric center of the conductive via 40a to the geometric center of the conductive via 40c.

In some embodiments, the width W3 can range from approximately 45 nm to approximately 3240 nm. In some embodiments, the length L3 can range from approximately 27 nm to approximately 10000 nm. In some embodiments, the ratio W3/L3 can range from approximately 0.07 to approximately 222.22.

Figure 7:
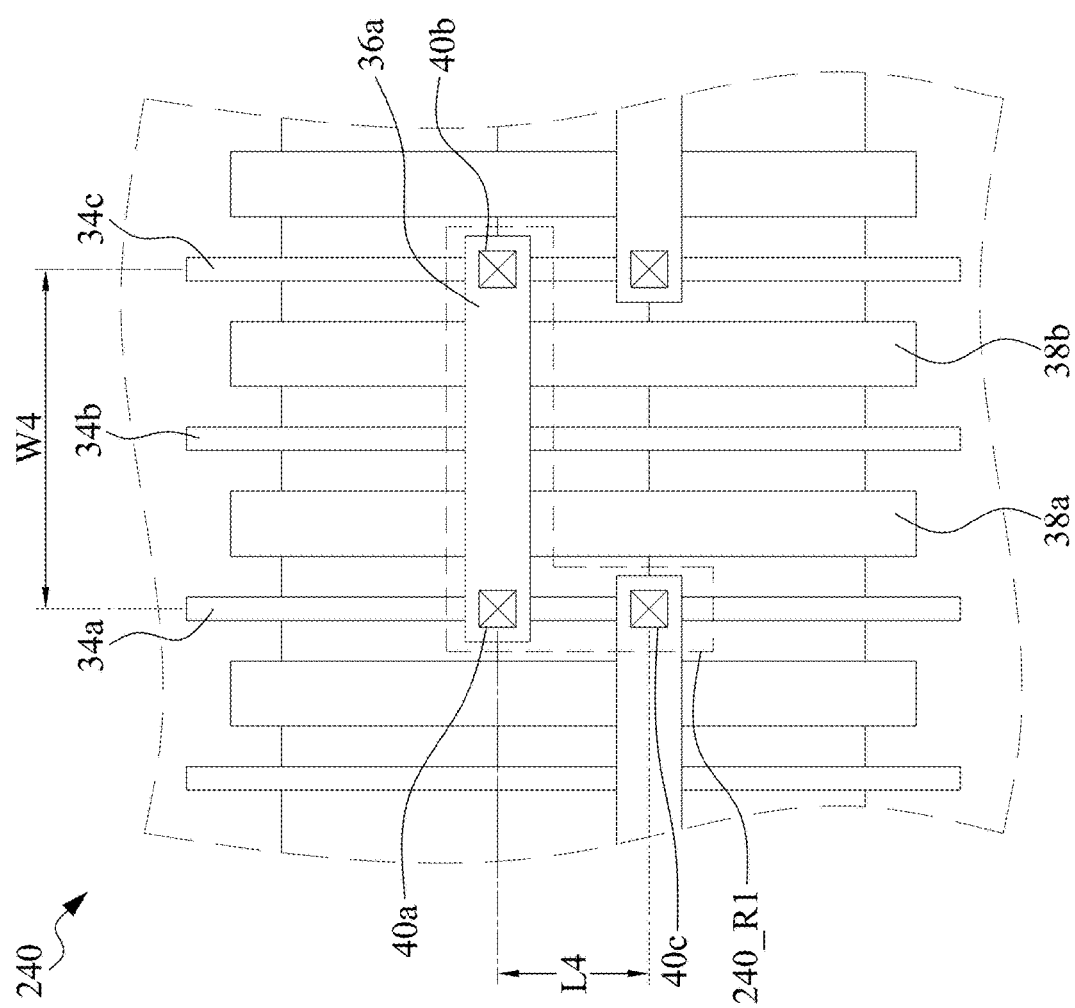
FIG. 7 illustrates a top view of a semiconductor device, in accordance with some embodiments of the present disclosure.

FIG. 7 illustrates a top view of a semiconductor device, in accordance with some embodiments of the present disclosure. FIG. 7 shows a semiconductor device 240. The semiconductor device 240 can be a portion of an electrical device. The semiconductor device 240 can be a portion of a termination circuit or a driver/driving circuit of an electrical device. The semiconductor device 240 can be integrated with a memory device.

The semiconductor device 240 is similar to the semiconductor device 220 shown in FIG. 6, except that the conductive layer 36a is connected between two gate regions (i.e., gate regions 34a and 34c) that are not adjacent to each other.

Referring to FIG. 7, two conductive layers 38a and 38b can be disposed between the gate regions 34a and 34c. In addition, the gate region 34b can be disposed between the gate regions 34a and 34c.

The conductive layer 36a can be isolated from the conductive layers 38a and 38b. The conductive layer 36a can be spaced apart from the conductive layers 38a and 38b. The conductive layer 36a can be isolated from the gate region 34b. The conductive layer 36a can be spaced apart from the gate region 34b.

The conductive layer 36a, the gate region 34a, and the conductive vias 40a, 40b and 40c can correspond to a resistor 240_R1. The resistor 240_R1 can be used as a basic component/unit for the ODT. The dimension or the size of the resistor 240_R1 can be characterized by a width W4 and a length L4.

The width W4 can be the center-to-center (or edge-to-edge) distance between the gate regions 34a and 34c. The length L4 can be the distance measured from the geometric center of the conductive via 40a to the geometric center of the conductive via 40c.

In some embodiments, the width W4 can range from approximately 45 nm to approximately 3240 nm. In some embodiments, the length L4 can range from approximately 27 nm to approximately 10000 nm. In some embodiments, the ratio W4/L4 can range from approximately 0.07 to approximately 222.22.

Figure 8:
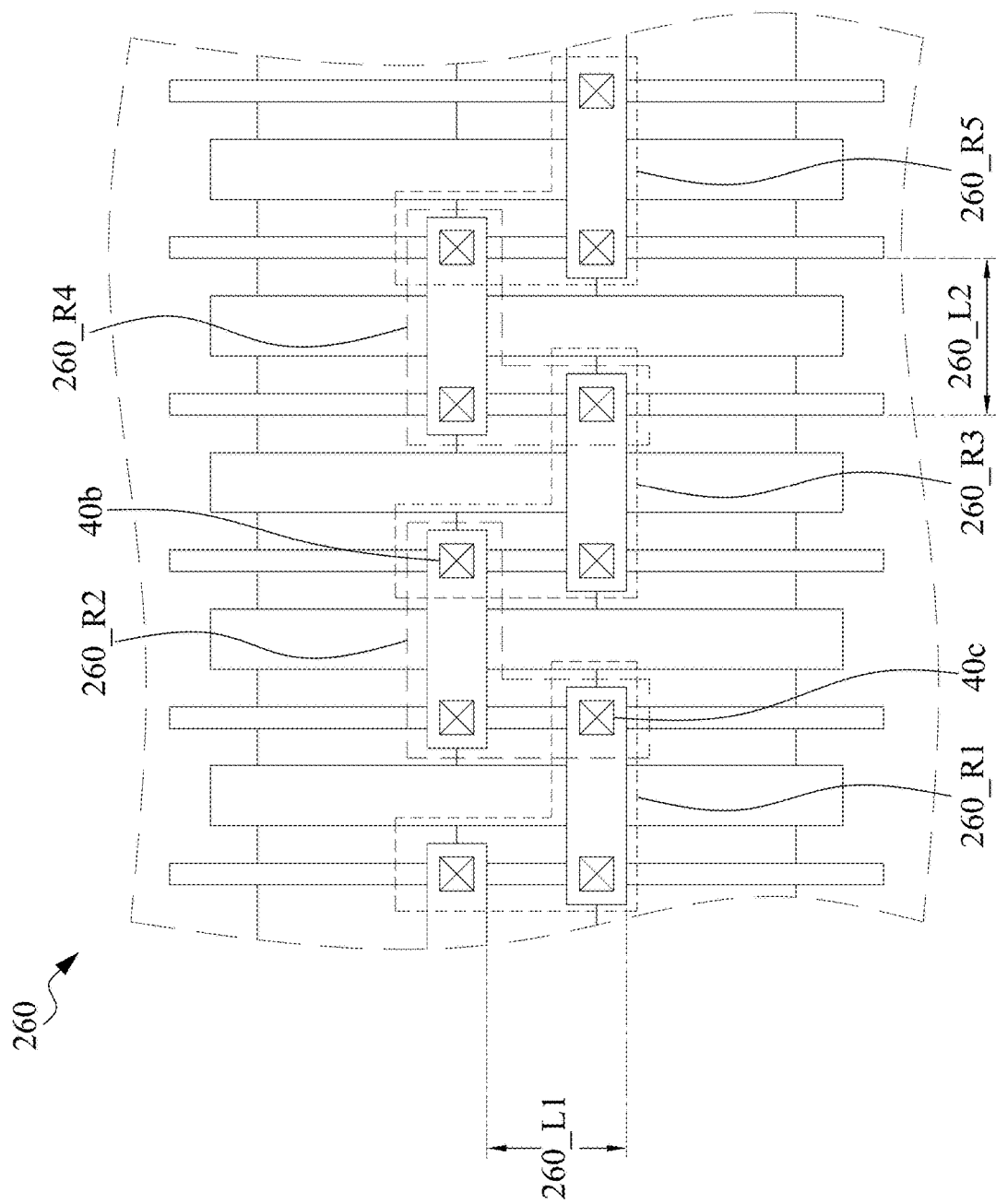
FIG. 8 illustrates a top view of a semiconductor device, in accordance with some embodiments of the present disclosure.

FIG. 8 illustrates a top view of a semiconductor device, in accordance with some embodiments of the present disclosure. FIG. 8 shows a semiconductor device 260. The semiconductor 260 is similar to the semiconductor 220 of FIG. 6. The calculation of the resistance of a basic component/unit for the ODT will be discussed in accordance with FIG. 8.

The semiconductor 260 includes resistors 260_R1, 260_R2, 260_R3, 260_R4 and 260_R5. Each of the resistors 260_R1, 260_R2, 260_R3, 260_R4 and 260_R5 can be a basic component/unit for the ODT.

Referring to FIG. 8, each of the resistors 260_R1, 260_R2, 260_R3, 260_R4 and 260_R5 includes a horizontal conductive layer and a gate region. In addition, each of the resistors 260_R1, 260_R2, 260_R3, 260_R4 and 260_R5 includes three conductive vias, and two adjacent resistors share one conductive via. For example, the resistors 260_R1 and 260_R2 share the conductive via 40c, and the resistors 260_R2 and 260_R3 share the conductive via 40b.

Therefore, the resistance of a basic component/unit for the ODT can be calculated based on the resistance of a horizontal conductive layer, the resistance a gate region, and the resistance of two conductive vias. The resistors 220_R1, 240_R1 and 260_R1 to 260_R5 can be referred to as the TYPE_B resistor, and the resistance of TYPE_B resistor can be calculated using the equation below:

$$R_{TYPE\_B} = n2 \times R_G + m2 \times R_H + 2 \times R_C \quad \text{(equation 3)}$$

Wherein the symbol $R_G$ represents the resistance per pitch of the gate region, the symbol $R_H$ represents the resistance per pitch of a horizontal conductive layer, the symbol $R_C$ represents the resistance of a conductive via. The number n2 represents a multiple, and the number m2 represents a multiple. In the subject application, a pitch refers to the minimum center-to-center distance (or edge-to-edge distance) between conductive layers or gate regions.

For example, if the pitch between two horizontal conductive lines of the semiconductor device 260 is 0.035 um, then the distance 260_L1 can be n2 times of 0.035 um. For example, if the pitch between two gate regions of the semiconductor device 260 is 0.057 um, then the distance 260_L2 can be m2 times of 0.057 um. It should be noted that the number n2 and the number m2 can be selected during the manufacturing of the semiconductor device 260, and the value of the $R_{TYPE\_B}$ can vary depending on the numbers n2 and m2 selected.

Furthermore, the total resistance of the semiconductor device 260 can be calculated using the equation below:

$$R_{TOTAL\_B} = p2 \times R_{TYPE\_B} \quad \text{(equation 4)}$$

Wherein the number p2 represents the number of TYPE_B resistors that the semiconductor device 260 includes. Table 3 below shows the value of the resistance $R_{TOTAL\_B}$ in different cases with various combinations of the number m2, n2 and p2. The total resistance $R_{TOTAL\_B}$ is calculated assuming that the $R_G$ is 1,500Ω, that $R_H$ is 50Ω, and that $R_C$ is 40Ω.

TABLE 3

| Cases: | No. 1 | No. 2 | No. 3 | No. 4 | No. 5 |
|---|---|---|---|---|---|
| m2 | 1 | 2 | 1 | 3 | 2 |
| n2 | 6 | 10 | 8 | 4 | 20 |
| p2 | 2 | 1 | 3 | 4 | 2 |
| $R_{TOTAL\_B}$ (Ω) | 18,000 | 15,000 | 36,000 | 25,000 | 60,000 |

Figure 9A:
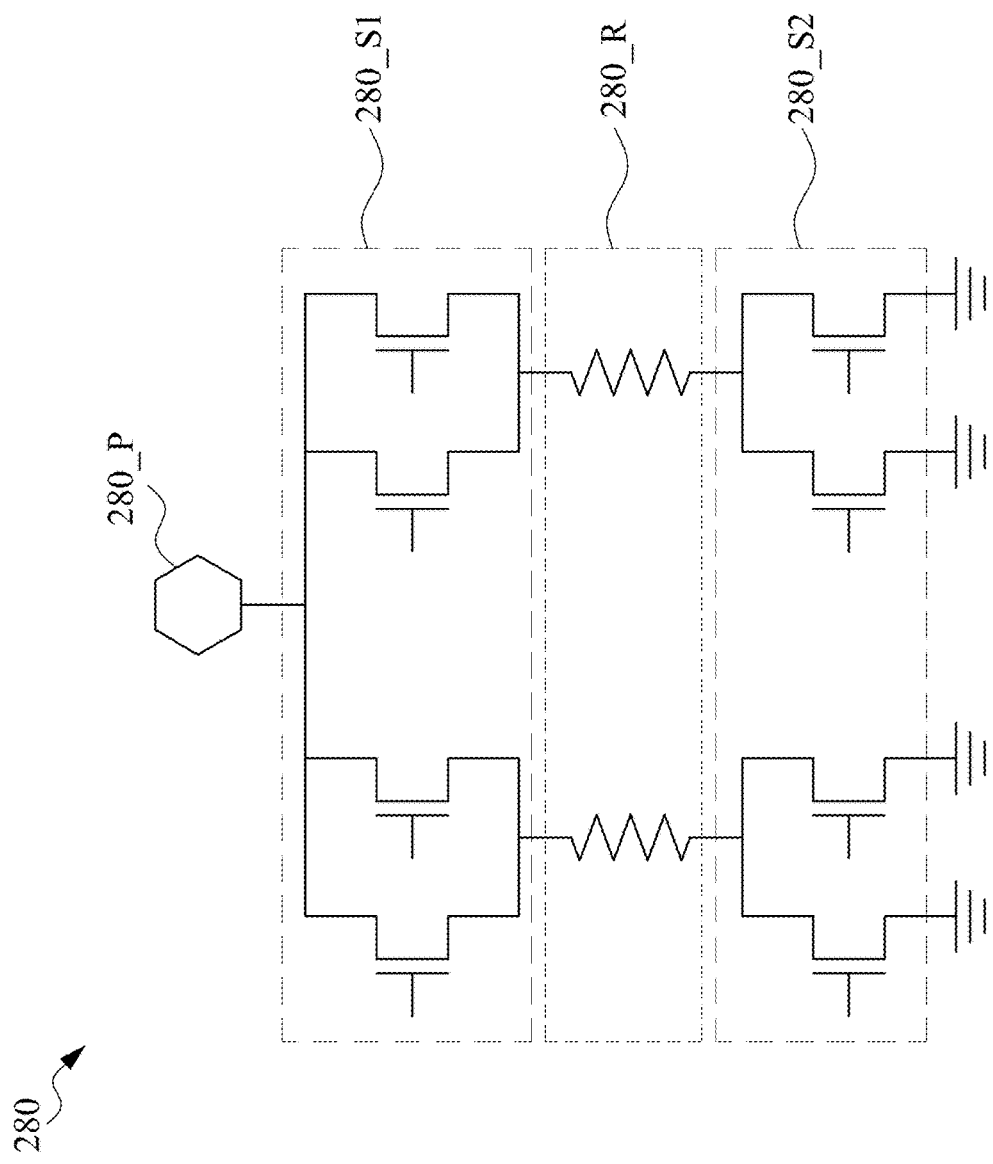
FIG. 9A illustrates a schematic view of a circuit, in accordance with some embodiments of the present disclosure.

FIG. 9A illustrates a schematic view of a circuit, in accordance with some embodiments of the present disclosure. FIG. 9A shows a circuit 280. The circuit 280 can be a termination circuit of an electrical device. The circuit 280 can be a driver/driving circuit of an electrical device. The circuit 280 can be integrated with a memory device. The circuit 280 can be an on-die termination or a driver/driving circuit of a memory device.

The circuit 280 includes a pad 280_P, resistor 280_R, and transistor stacks 280_S1 and 280_S2. The transistor stack 280_S1 can include a plurality of transistors, wherein the drain terminals of the transistors are connected together, and the source terminals of the transistors are connected together. The transistor stack 280_S2 can include a plurality of transistors, wherein the drain terminals of the transistors are connected together, and the source terminals of the transistors are connected together. Each of the transistors of the transistor stack 280_S1 can be connected to the pad 280_P. Each of the transistors of the transistor stack 280_S2 can be connected to the ground.

In some embodiments, the transistors included in the transistor stacks 280_S1 and the 280_S2 can be n-type MOSFETs. In some embodiments, the transistors included in the transistor stacks 280_S1 and the 280_S2 can be p-type MOSFETs. In some embodiments, the number of transistors included in the transistor stack 280_S1 can be identical to that included in the transistor stack 280_S2. In some embodiments, the number of transistors included in the transistor stack 280_S1 can be different from that included in the transistor stack 280_S2.

The pad 280_P can be a conductive contact that is configured to be connected to external devices. In some embodiments, the pad 280_P can be a contact of a memory device that is configured to, for example, connect a slot for receiving the memory device. The resistor 280_R can be a TYPE_B resistor as elaborated in accordance with FIGS. 6-8.

Figure 9B:
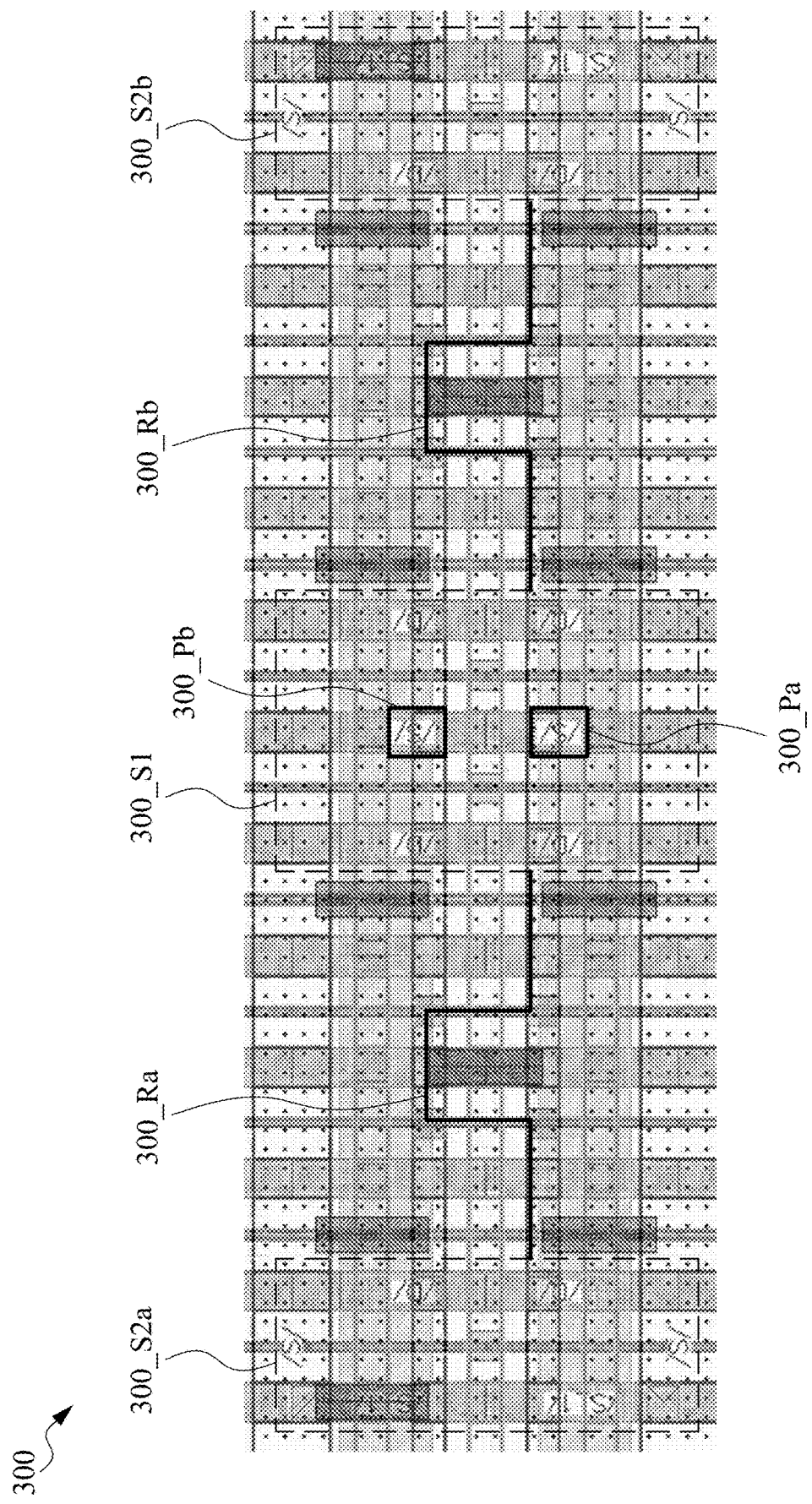
FIG. 9B illustrates a schematic view of a semiconductor layout, in accordance with some embodiments of the present disclosure.

FIG. 9B illustrates a schematic view of a semiconductor layout, in accordance with some embodiments of the present disclosure. FIG. 9B shows a semiconductor layout 300. The semiconductor layout 300 can correspond to the circuit 280 shown in FIG. 9A.

The semiconductor layout 300 includes pads 300_Pa and 300_Pb, resistors 300_Ra and 300_Rb, and transistor stacks 300_S1, 300_S2a and 300_S2b.

The resistor 300_Ra can be disposed between the transistor stacks 300_S1 and 300_S2a. The resistor 300_Ra can be electrically connected between the transistor stacks 300_S1 and 300_S2a. The resistor 300_Rb can be disposed between the transistor stacks 300_S1 and 300_S2b. The resistor 300_Rb can be electrically connected between the transistor stacks 300_S1 and 300_S2b.

The resistors 300_Ra and 300_Rb of the semiconductor layout 300 may correspond to the resistor 280_R of the circuit 280. The transistor stack 300_S1 of the semiconductor layout 300 may correspond to the transistor stack 280_S1 of the circuit 280. The transistor stacks 300_S2a and 300_S2b of the semiconductor layout 300 may correspond to the transistor stack 280_S2 of the circuit 280. The pads 300_Pa and 300_Pb of the semiconductor layout 300 may correspond to the pad 280_P of the circuit 280.

Figure 10A:
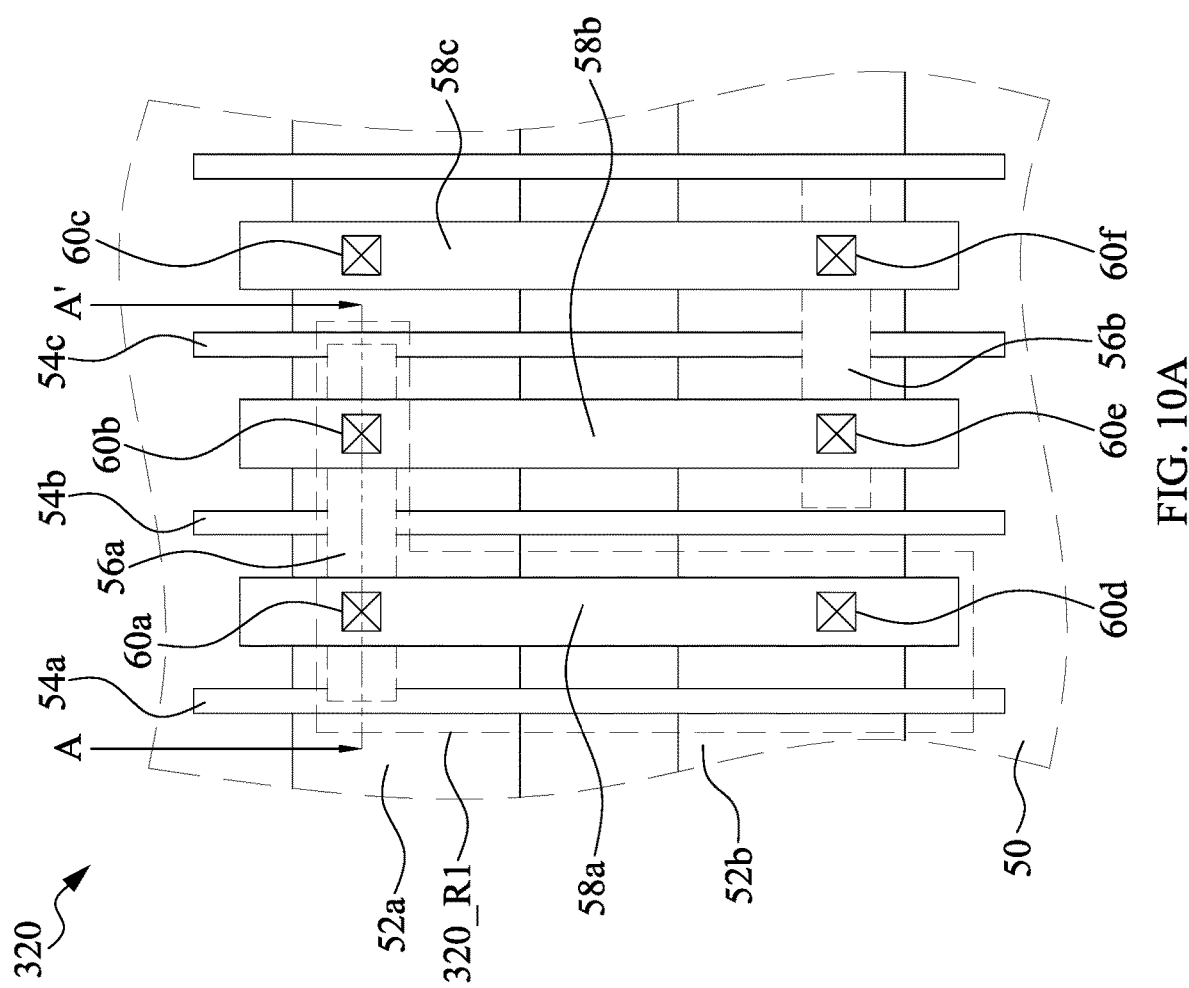
FIG. 10A illustrates a top view of a semiconductor device, in accordance with some embodiments of the present disclosure.

FIG. 10A illustrates a top view of a semiconductor device, in accordance with some embodiments of the present disclosure.

FIG. 10A shows a semiconductor device 320. The semiconductor device 320 can be a portion of an electrical device. The semiconductor device 320 can be a portion of a termination circuit of an electrical device. The semiconductor device 320 can be a portion of a driver/driving circuit of an electrical device. The semiconductor device 320 can be integrated with a memory device.

The semiconductor device 320 includes a substrate 50, active regions 52a and 52b, gate regions 54a, 54b and 54c, conductive layers 56a, 56b, 58a, 58b and 58c, and conductive vias 60a, 60b, 60c, 60d, 60e and 60f. The active regions 52a and 52b can be the source region or the drain region of a transistor. The gate regions 54a, 54b and 54c can be a polysilicon gate or a metal gate. The conductive layers 16a and 16b can extend in a substantially identical direction. The conductive layers 56a and 56b can be substantially parallel to each other. The conductive layers 58a, 58b and 58c can extend in a direction different from that of the conductive layers 56a and 56b. The conductive layers 58a, 58b and 58c can be substantially parallel to each other. The conductive layers 58a, 58b and 58c can be substantially perpendicular to the conductive layers 56a and 56b. The conductive layers 56a and 56b can be disposed on a first side of the substrate 50. The conductive layers 58a, 58b and 58c can be disposed on a second side opposite the first side of the substrate 50.

The conductive layers 56a and 56b are depicted with dotted lines because they are actually in the backside of the semiconductive device 320 and thus cannot be seen from the top view. The position of the conductive layer 56a with respect to the conductive layers 58a and 58b will be elaborated on later, in accordance with FIG. 10B.

The conductive vias 60a, 60b, 60c, 60e, and 60f are depicted with dotted lines because they may not be seen from the top view.

The conductive layer 58a can be disposed between the gate regions 54a and 54b. The conductive layer 58a can be isolated from the gate regions 54a and 54b. The conductive layer 58a can be separated from the gate regions 54a and 54b. The conductive layer 58a can be spaced apart from the gate regions 54a and 54b.

The conductive layer 58b can be disposed between the gate regions 54b and 54c. The conductive layer 58b can be isolated from the gate regions 54b and 54c. The conductive layer 58b can be separated from the gate regions 54b and 54c. The conductive layer 58b can be spaced apart from the gate regions 54b and 54c.

The conductive via 60a can penetrate the conductive layer 58a, the active region 52a, and the conductive layer 56a. The conductive via 60a can be partially embedded within the conductive layer 58a, the active region 52a, and the conductive layer 56a. The conductive via 60b can penetrate the conductive layer 58b, the active region 52a, and the conductive layer 56a. The conductive via 60b can be partially embedded within the conductive layer 58b, the active region 52a, and the conductive layer 56a.

The conductive via 60e can penetrate the conductive layer 58b, the active region 52b, and the conductive layer 56b. The conductive via 60e can be partially embedded within the conductive layer 58b, the active region 52b, and the conductive layer 56b. The conductive via 60f can penetrate the conductive layer 58c, the active region 52b, and the conductive layer 56b. The conductive via 60f can be partially embedded within the conductive layer 58c, the active region 52b, and the conductive layer 56b.

The conductive layers 58a and 58b can be electrically connected through the conductive layer 56a and the conductive vias 60a and 60b. The conductive layers 58b and 58c can be electrically connected through the conductive layer 56b and the conductive vias 60e and 60f.

The conductive layer 56a, the conductive layer 58a and the conductive vias 60a, 60b and 60d can correspond to a resistor 320_R1. The resistor 320_R1 can be used as a basic component/unit for the ODT. The resistor 320_R1 is in fact similar to the TYPE_A resistor shown in FIG. 1, and thus resistor 320_R1 can be referred to as a TYPE_A' resistor.

Figure 10B:
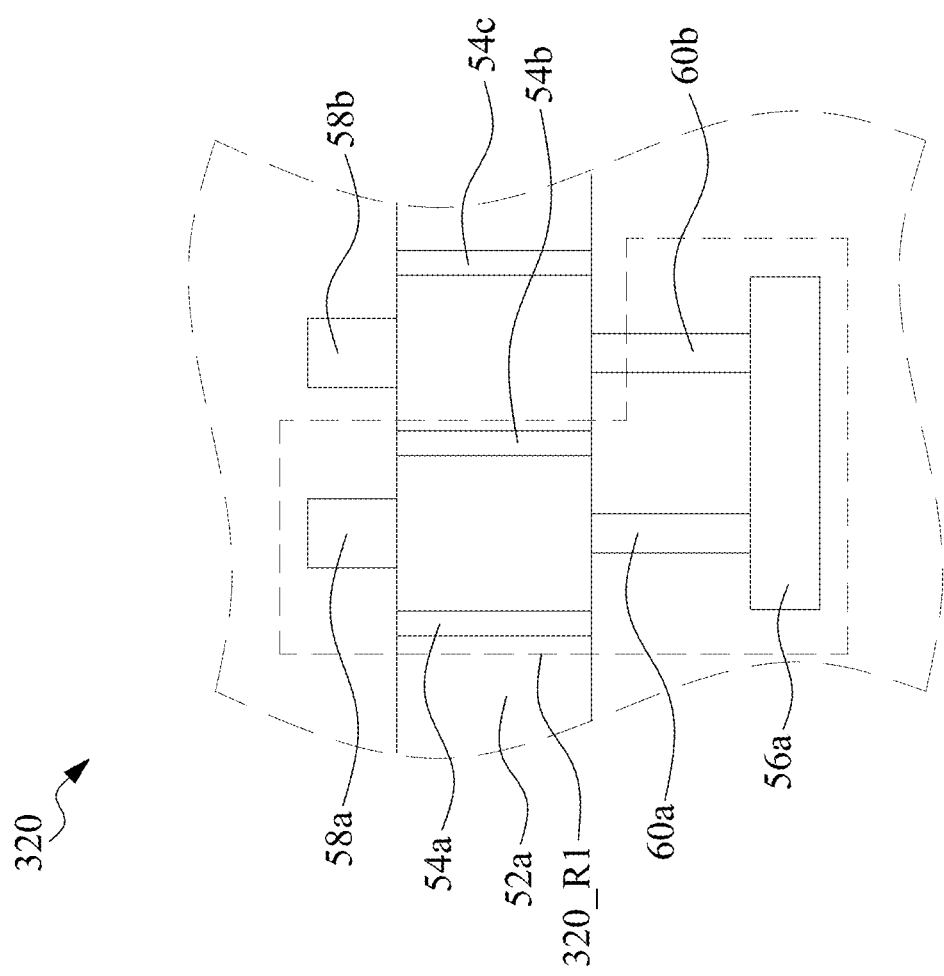
FIG. 10B illustrates a cross-sectional view of a semiconductor device, in accordance with some embodiments of the present disclosure.

FIG. 10B illustrates a cross-sectional view of a semiconductor device, in accordance with some embodiments of the present disclosure. FIG. 10B shows a cross-sectional view of the semiconductor device 320 along the dotted-line A-A' of FIG. 10A.

The conductive layers 58a and 58b are located at the upper side of the active region 52a. The conductive layer 56a is located below the bottom side of the active region 52a. The conductive layer 56a can be spaced apart from the active region 52a. The conductive layer 56a can be spaced apart from the gate regions 54a, 54b and 54c.

The conductive via 60a may penetrate the conductive layers 58a, the active region 52a and the conductive layer 56a. The conductive via 60b may penetrate the conductive layers 58b, the active region 52a and the conductive layer 56a. The conductive layer 56a, the conductive layer 58a and the conductive vias 60a, 60b and 60d (not shown) can correspond to a resistor 320_R1. The resistor 320_R1 can be used as a basic component/unit for the ODT.

Figure 11:
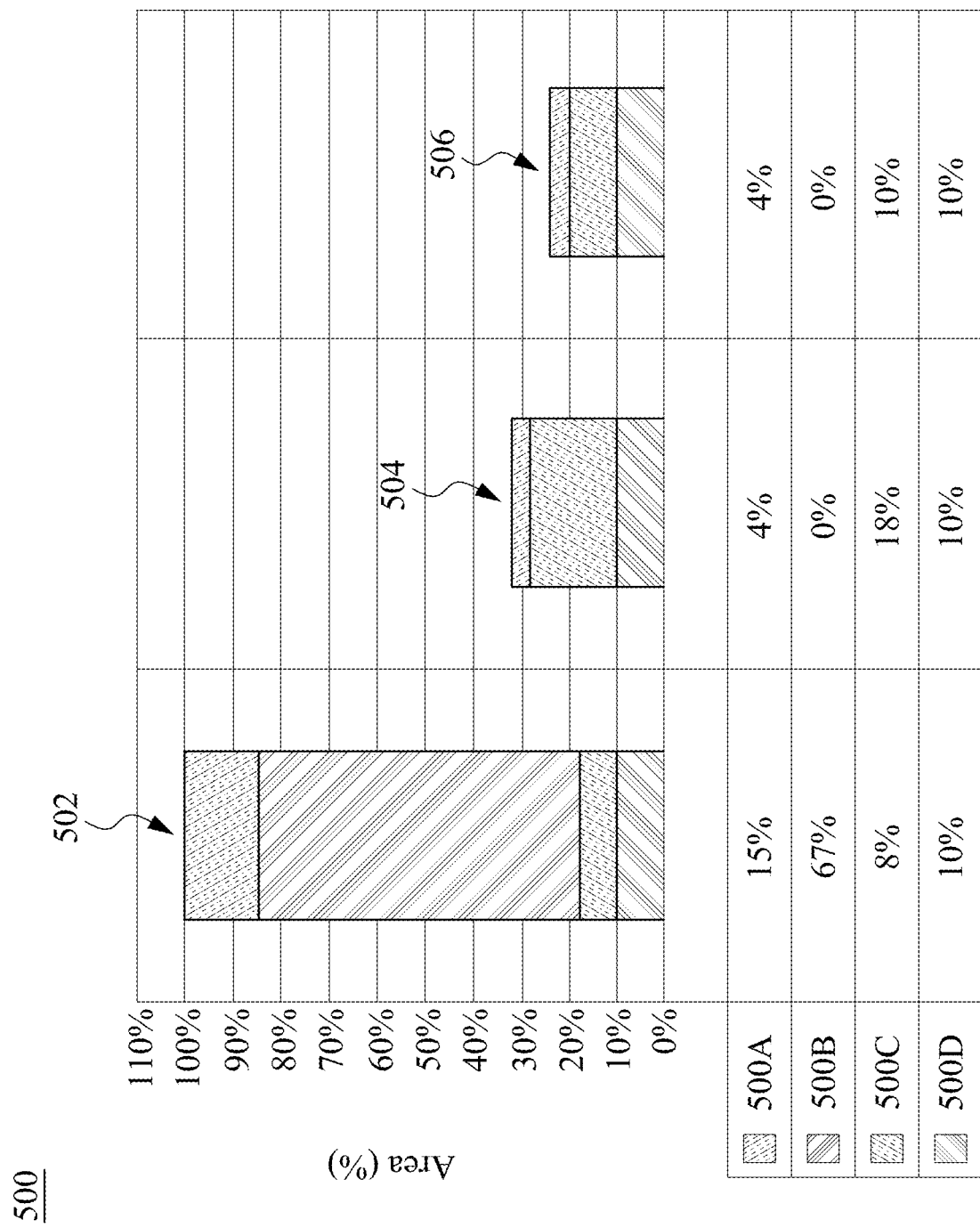
FIG. 11 illustrates a diagram showing the percentage of area for each component of different ODT or driver/driving circuits, in accordance with some embodiments of the present disclosure.

FIG. 11 illustrates a diagram showing the percentage of area for each component of different ODT or driver/driving circuits, in accordance with some embodiments of the present disclosure. FIG. 11 illustrates a diagram 500 including histograms 502, 504 and 506. The histogram 502 represents an ODT or a driver/driving circuit that uses TiN resistors. The histogram 504 represents an ODT or a driver/driving circuit that uses TYPE_A resistors. The histogram 506 represents an ODT or a driver/driving circuit that uses TYPE_B resistors.

The reference numeral 500A represents the percentage of the area contributed by wiring/routing of a device/circuit. The reference numeral 500B represents the percentage of the area contributed by TiN resistors. The reference numeral 500C represents the percentage of the area contributed by pull-down transistors (i.e., the transistors connected to the ground). The reference numeral 500D represents the percentage of the area contributed by pull-up transistors (i.e., the transistors connected to the pad or the source voltage).

Based on the diagram 500, it can be understood that the area for TiN resistors can be eliminated in both the histograms 504 and 506. That is, using TYPE_A or TYPE_B resistors may facilitate the miniaturization of the ODT or driver/driving circuit within a semiconductor device.

Figure 12:
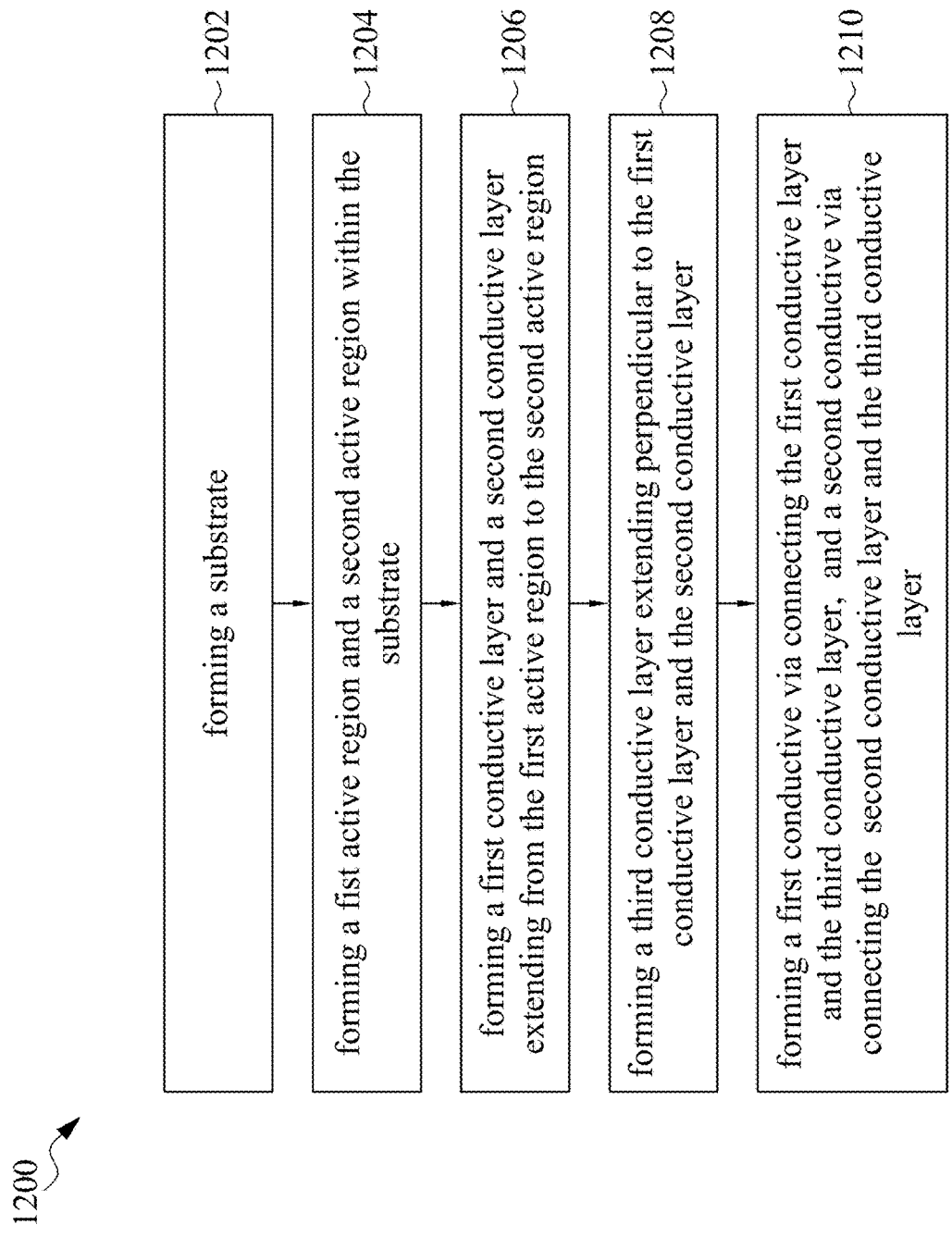
FIG. 12 illustrates a flow chart including operations for manufacturing a TYPE_A resistor, in accordance with some embodiments of the present disclosure.

FIG. 12 illustrates a flow chart including operations for manufacturing a TYPE_A resistor, in accordance with some embodiments of the present disclosure.

FIG. 12 shows a flow chart 1200. The flow chart 1200 includes operations 1202, 1204, 1206, 1208 and 1210. Although the operations 1202, 1204, 1206, 1208 and 1210 of FIG. 12 are depicted in sequence, it can be contemplated that the operations 1202, 1204, 1206, 1208 and 1210 can be performed in an order different from that shown in FIG. 12.

In the operation 1202, a substrate is formed. The substrate formed in the operation 1202 can be the substrate 10 of FIG. 1.

In the operation 1204, a first active region and a second active region are formed within the substrate. The first active region formed in the operation 1204 can be the active region 12a of FIG. 1. The second active region formed in the operation 1204 can be the active region 12b of FIG. 1.

In the operation 1206, a first conductive layer and a second conductive layer extending from the first active region to the second active region are formed. The first conductive layer formed in the operation 1206 can be the conductive layer 18a of FIG. 1. The second conductive layer formed in the operation 1206 can be the conductive layer 18b of FIG. 1.

In the operation 1208, a third conductive layer extending perpendicular to the first conductive layer and the second conductive layer is formed. The third conductive layer formed in the operation 1208 can be the conductive layer 16b of FIG. 1.

In the operation 1210, a first conductive via connecting the first conductive layer and the third conductive layer is formed, and a second conductive via connecting the second conductive layer and the third conductive layer is formed. The first conductive via formed in the operation 1210 can be the conductive via 20a of FIG. 1. The second conductive via formed in the operation 1210 can be the conductive via 20b of FIG. 1.

Figure 13:
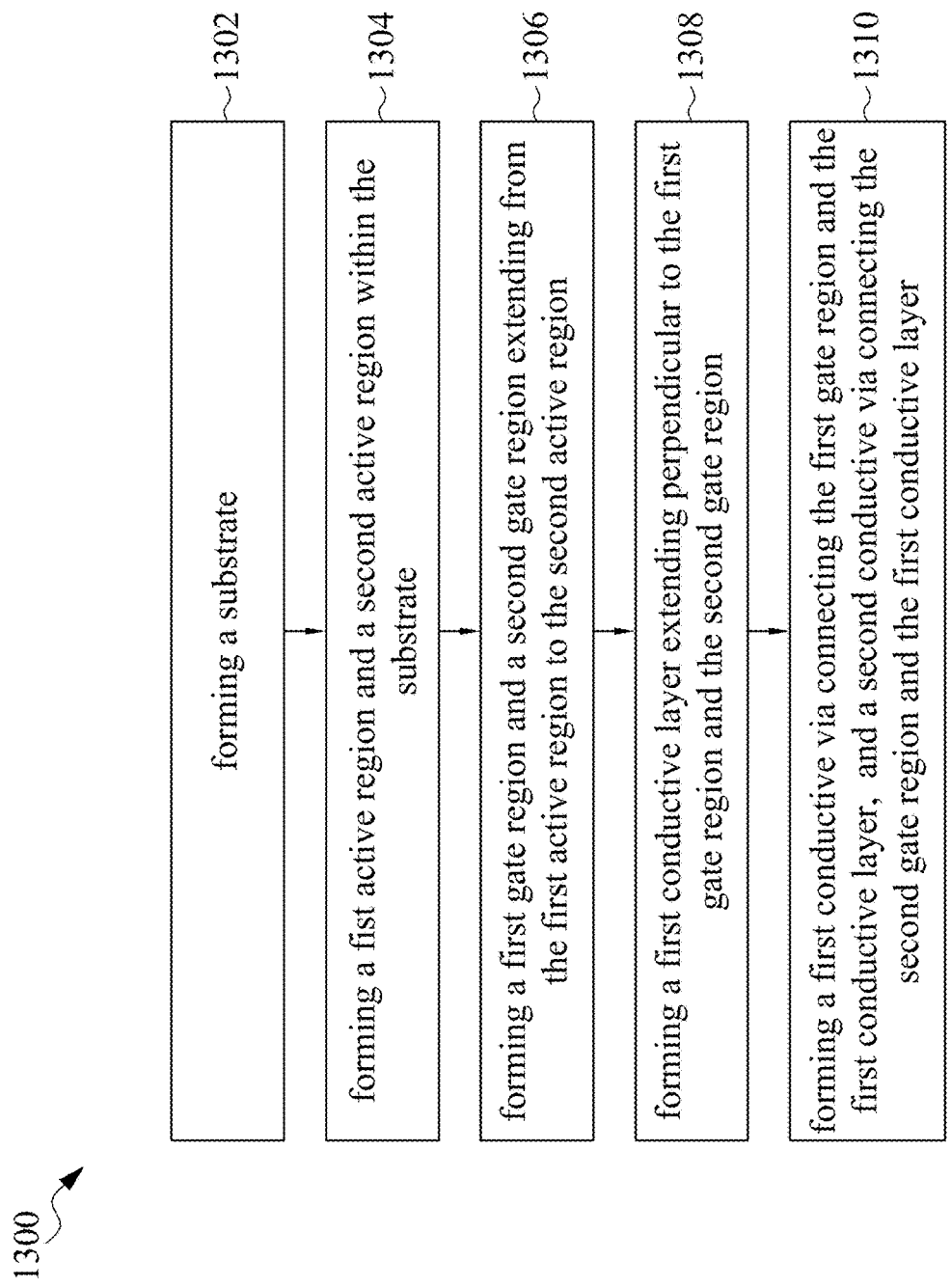
FIG. 13 illustrates a flow chart, including operations for manufacturing a TYPE_B resistor, in accordance with some embodiments of the present disclosure.

FIG. 13 illustrates a flow chart including operations for manufacturing a TYPE_B resistor, in accordance with some embodiments of the present disclosure.

FIG. 13 shows a flow chart 1300. The flow chart 1300 includes operations 1302, 1304, 1306, 1308 and 1310. Although the operations 1302, 1304, 1306, 1308 and 1310 of FIG. 13 are depicted in sequence, it can be contemplated that the operations 1302, 1304, 1306, 1308 and 1310 can be performed in an order different from that shown in FIG. 13.

In the operation 1302, a substrate is formed. The substrate formed in the operation 1302 can be the substrate 30 of FIG. 6.

In the operation 1304, a first active region and a second active region is formed within the substrate. The first active region formed in the operation 1304 can be the active region 32a of FIG. 6. The second active region formed in the operation 1304 can be the active region 32b of FIG. 6.

In the operation 1306, a first gate region and a second gate region extending from the first active region to the second active region are formed. The first gate region formed in the operation 1306 can be the gate region 34a of FIG. 6. The second gate region formed in the operation 1306 can be the conductive layer 34b of FIG. 6.

In the operation 1308, a first conductive layer extending perpendicular to the first gate region and the second gate region is formed. The first conductive layer formed in the operation 1308 can be the conductive layer 36a of FIG. 6.

In the operation 1310, a first conductive via connecting the first gate region and the first conductive layer is formed, and a second conductive via connecting the second gate region and the first conductive layer is formed. The first conductive via formed in the operation 1310 can be the conductive via 40a of FIG. 6. The second conductive via formed in the operation 1310 can be the conductive via 40b of FIG. 6.

Some embodiments of the present disclosure provide a semiconductor component for a memory device. The semiconductor component comprises a first active region extending in a first direction; a second active region extending in the first direction; a first conductive layer disposed across the first active region and the second active region, in a second direction substantially perpendicular to the first direction; a second conductive layer extending in the first direction; and a first conductive via connecting the first conductive layer and the second conductive layer.

Some embodiments of the present disclosure provide a semiconductor component for a memory device. The semiconductor component comprises a first active region extending in a first direction; a second active region extending in the first direction; a first gate region disposed across the first active region and the second active region, in a second direction substantially perpendicular to the first direction; a first conductive layer extending in the first direction; and a first conductive via connecting the first conductive layer and the first gate region.

Some embodiments of the present disclosure provide a method of forming a semiconductor component for a memory device. The method comprises: forming a substrate; forming a first active region and a second active region within the substrate; forming a first conductive layer and a second conductive layer extending from the first active region to the second active region; forming a third conductive layer extending perpendicular to the first conductive layer and the second conductive layer; and forming a first conductive via connecting the first conductive layer and the third conductive layer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor component for a memory device, comprising:
   a first conductive layer extending in a first direction;
   a second conductive layer extending in the first direction;
   a first gate region extending in the first direction and disposed between the first conductive layer and the second conductive layer;
   a third conductive layer extending in the first direction;
   a fourth conductive layer extending in a second direction substantially perpendicular to the first direction; and
   a fifth conductive layer extending in the second direction, wherein
   a first edge of the first conductive layer is substantially aligned with a first edge of the second conductive layer and a first edge of the third conductive layer;
   the first conductive layer and the second conductive layer are electrically connected through the fourth conductive layer;
   the second conductive layer and the third conductive layer are electrically connected through the fifth conductive layer; and
   the first gate region is isolated from the fourth conductive layer.

2. The semiconductor component of claim 1, wherein the fourth conductive layer and the fifth conductive layer are spaced apart by a first distance.

3. The semiconductor component of claim 1, wherein the first gate region is spaced apart from the first conductive layer and the second conductive layer.

4. The semiconductor component of claim 3, wherein the first conductive layer and second conductive layer are isolated from the first gate region.

5. The semiconductor component of claim 3, further comprising a second gate region disposed between the second conductive layer and the third conductive layer, wherein the second gate region is spaced apart from the second conductive layer and the third conductive layer.

6. The semiconductor component of claim 5, wherein the fifth conductive layer is isolated from the second gate region.

7. The semiconductor component of claim 1, wherein the first conductive layer, the second conductive layer, and third conductive layer are disposed at a first elevation level.

8. The semiconductor component of claim 7, wherein the fourth conductive layer and the fifth conductive layer are disposed at a second elevation level different than the first elevation level.

9. The semiconductor component of claim 1, wherein a second edge of the first conductive layer is substantially aligned with a second edge of the second conductive layer.

10. The semiconductor component of claim 1, wherein a second edge of the third conductive layer is substantially aligned with a second edge of the second conductive layer.

11. A semiconductor component for a memory device, comprising:
    a first gate region extending in a first direction;
    a second gate region extending in the first direction;
    a third gate region extending in the first direction;
    a first conductive layer extending in a second direction substantially perpendicular to the first direction; and
    a second conductive layer extending in the second direction, wherein
    the first gate region and the second gate region are electrically connected through the first conductive layer; and
    the second gate region and the third gate region are electrically connected through the second conductive layer.

12. The semiconductor component of claim 11, wherein the first conductive layer and the second conductive layer are spaced apart by a first distance.

13. The semiconductor component of claim 11, further comprising a third conductive layer extending in the first direction and between the first gate region and the second gate region, wherein the third conductive layer is isolated from the first conductive layer.

14. The semiconductor component of claim 13, further comprising a fourth conductive layer extending in the first direction and between the second gate region and the third gate region, wherein the fourth conductive layer is isolated from the second conductive layer.

15. The semiconductor component of claim 14, wherein the first conductive layer and the second conductive layer are disposed at a first elevation level.

16. The semiconductor component of claim 15, wherein the third conductive layer and the fourth conductive layer are disposed at a second elevation level different than the first elevation level.

17. The semiconductor component of claim 11, wherein a first edge of the first gate region is substantially aligned with a first edge of the second gate region, and a second edge of the first gate region is substantially aligned with a second edge of the second gate region.

18. The semiconductor component of claim 14, wherein a first edge of the third conductive layer is substantially aligned with a first edge of the fourth conductive layer, and a second edge of the third conductive layer is substantially aligned with a second edge of the fourth conductive layer.

19. A method of forming a semiconductor component for a memory device, comprising:
    forming a substrate;
    forming a first active region and a second active region within the substrate;
    forming a first conductive layer, a second conductive layer, and a third conductive layer extending across the first active region and the second active region at a first elevation level;
    forming a fourth conductive layer and a fifth conductive layer extending perpendicular to the first conductive layer at a second elevation level;
    forming a first conductive via connecting the first conductive layer and the fourth conductive layer;
    forming a second conductive via connecting the second conductive layer and the fourth conductive layer;
    forming a third conductive via connecting the second conductive layer and the fifth conductive layer; and
    forming a fourth conductive via connecting the third conductive layer and the fifth conductive layer.

20. The method of claim 19, wherein a first edge of the first conductive layer is substantially aligned with a first edge of the second conductive layer and a first edge of the third conductive layer.

* * * * *